(12) United States Patent
Loubet et al.

(10) Patent No.: US 10,134,759 B2
(45) Date of Patent: Nov. 20, 2018

(54) SEMICONDUCTOR DEVICE INCLUDING GROUPS OF NANOWIRES OF DIFFERENT SEMICONDUCTOR MATERIALS AND RELATED METHODS

(71) Applicants: STMICROELECTRONICS, INC., Coppell, TX (US); INTERNATIONAL BUSINESS MACHINES CORPORATION, Armonk, NY (US)

(72) Inventors: Nicolas Loubet, Guilderland, NY (US); James Kuss, Hudson, NY (US)

(73) Assignees: STMICROELECTRONICS, INC., Coppell, TX (US); INTERNATIONAL BUSINESS MACHINES CORPORATION, Armonk, NY (US)

( * ) Notice: Subject to any disclaimer, the term of this patent is extended or adjusted under 35 U.S.C. 154(b) by 193 days.

(21) Appl. No.: 14/182,601

(22) Filed: Feb. 18, 2014

(65) Prior Publication Data
US 2015/0236050 A1 Aug. 20, 2015

(51) Int. Cl.
| H01L 21/8238 | (2006.01) |
|---|---|
| H01L 27/12 | (2006.01) |
| H01L 27/092 | (2006.01) |
| H01L 21/84 | (2006.01) |
| H01L 29/16 | (2006.01) |

(Continued)

(52) U.S. Cl.
CPC .. *H01L 27/1211* (2013.01); *H01L 21/823807* (2013.01); *H01L 21/823821* (2013.01); *H01L 21/84* (2013.01); *H01L 21/845* (2013.01); *H01L 27/0922* (2013.01); *H01L 27/0924* (2013.01); *H01L 27/1203* (2013.01); *H01L 29/0673* (2013.01); *H01L 29/16* (2013.01); *H01L 29/161* (2013.01); *H01L 29/78696* (2013.01);

(Continued)

(58) Field of Classification Search
CPC ........... H01L 29/41791; H01L 29/1033; H01L 29/66795; H01L 29/66818; H01L 29/7853; H01L 29/7854; H01L 29/7858; H01L 29/78696; H01L 29/0673; H01L 27/1211; H01L 21/845; H01L 21/823821; H01L 21/02603; H01L 21/823431; H01L 21/823

See application file for complete search history.

(56) References Cited

U.S. PATENT DOCUMENTS

| 8,580,624 B2 | 11/2013 | Bangsaruntip et al. |
|---|---|---|
| 2008/0014689 A1* | 1/2008 | Cleavelin .............. B82Y 10/00 438/197 |
| 2009/0026505 A1* | 1/2009 | Okano ............. H01L 29/66795 257/255 |
| 2009/0090934 A1* | 4/2009 | Tezuka ................ H01L 27/1211 257/190 |

(Continued)

OTHER PUBLICATIONS

U.S. Appl. No. 14/182,632, filed Feb. 18, 2014.

*Primary Examiner* — Davienne Monbleau
*Assistant Examiner* — Leslie Pilar Cruz
(74) *Attorney, Agent, or Firm* — Seed IP Law Group LLP

(57) ABSTRACT

A method for making a semiconductor device may include forming, above a substrate, a plurality of fins, forming a first semiconductor material on sides of a first group of the fins, and forming a second semiconductor material on sides of a second group of the fins. The method may further include forming a dielectric layer overlying the plurality of fins to define first and second groups of nanowires within the dielectric layer, with the first group of nanowires including the first semiconductor material and the second group of nanowires including the second semiconductor material.

16 Claims, 15 Drawing Sheets

(51) Int. Cl.
*H01L 29/161* (2006.01)
*H01L 29/06* (2006.01)
*H01L 29/786* (2006.01)
*H01L 21/02* (2006.01)

(52) U.S. Cl.
CPC .... *H01L 21/0243* (2013.01); *H01L 21/02532* (2013.01); *H01L 21/02603* (2013.01)

(56) References Cited

U.S. PATENT DOCUMENTS

| | | | |
|---|---|---|---|
| 2010/0164102 A1* | 7/2010 | Rachmady | B82Y 10/00 257/741 |
| 2010/0295024 A1 | 11/2010 | Pernel et al. | |
| 2010/0304555 A1* | 12/2010 | Kaneko | H01L 21/845 438/585 |
| 2011/0108920 A1* | 5/2011 | Basker | H01L 21/845 257/351 |
| 2011/0298058 A1* | 12/2011 | Kawasaki | H01L 29/7853 257/401 |
| 2012/0007051 A1 | 1/2012 | Bangsaruntip et al. | |
| 2012/0276695 A1* | 11/2012 | Cheng | H01L 27/1211 438/154 |
| 2013/0075797 A1 | 3/2013 | Okano | |
| 2013/0234215 A1* | 9/2013 | Okano | H01L 29/42392 257/255 |
| 2013/0270512 A1 | 10/2013 | Radosavljevic et al. | |
| 2014/0151639 A1 | 6/2014 | Chang et al. | |
| 2014/0225065 A1 | 8/2014 | Rachmady et al. | |
| 2015/0214059 A1* | 7/2015 | Bouche | H01L 21/2807 257/369 |

\* cited by examiner

SEMICONDUCTOR DEVICE INCLUDING GROUPS OF NANOWIRES OF DIFFERENT SEMICONDUCTOR MATERIALS AND RELATED METHODS

JOINT RESEARCH AGREEMENT

The subject matter claimed herein was made as a result of activities undertaken within the scope of a joint research agreement. The parties to the joint research agreement are (1) STMicroelectronics, Inc., and (2) GlobalFoundries, Inc.

FIELD OF THE INVENTION

The present invention relates to the field of electronic devices and, more particularly, to semiconductor devices and related methods.

BACKGROUND OF THE INVENTION

As semiconductor device sizes continue to get smaller, nanowires are becoming a more attractive alternative for interconnecting various device components in relatively small circuits. In addition to their relatively small dimensions, nanowires may exhibit certain properties not found in the same material in bulk form, which may also be advantageous in certain configurations.

One example device which incorporates nanowires is set forth in U.S. Pat. Pub. No. 2013/0270512 to Radosavljevic et al. This reference discloses architectures and techniques for co-integration of heterogeneous materials, such as group III-V semiconductor materials and group IV semiconductors (e.g., Ge) on a same substrate (e.g. silicon). Multi-layer heterogeneous semiconductor material stacks having alternating nanowire and sacrificial layers are employed to release nanowires and permit formation of a coaxial gate structure that completely surrounds a channel region of the nanowire transistor. Individual PMOS and NMOS channel semiconductor materials are co-integrated with a starting substrate having a blanket layers of alternating Ge/III-V layers.

Despite the existence of such configurations, further enhancements in semiconductor devices incorporating nanowires may be desirable in some applications, such as next generation devices with relatively small dimensions.

SUMMARY OF THE INVENTION

A method for making a semiconductor device may include forming, above a substrate, a plurality of fins, forming a first semiconductor material on sides of a first group of the fins, and forming a second semiconductor material on sides of a second group of the fins. The method may further include forming a dielectric layer overlying the plurality of fins to define first and second groups of nanowires within the dielectric layer, with the first group of nanowires comprising the first semiconductor material and the second group of nanowires comprising the second semiconductor material.

More particularly, forming the first and second semiconductor materials may further comprise forming at least one mask layer overlying the first and second groups of fins, and selectively removing the at least one mask layer to expose the first and second groups of fins prior to forming the first and second semiconductor materials, respectively. By way of example, the at least one mask layer may comprise at least one silicon nitride layer. Furthermore, the method may also include forming a first photoresist layer to cover the first group of pillars prior to removing the at least one mask layer from the second group of pillars, and forming a second photoresist layer to cover the second group of pillars prior to removing the at least one mask layer from the first group of pillars.

The nanowires of the first and second groups may have oval-shaped cross-sections, for example. By way of example, the first semiconductor material may comprise silicon, and the second semiconductor material may comprise silicon germanium. Each fin may have a lower semiconductor portion and an upper dielectric portion. Furthermore, the method may also include forming a first pair of source and drain regions and a first gate coupled with the first group of nanowires to define an n-channel field effect transistor (NFET), and forming a second pair of source and drain regions and a second gate coupled with the second group of nanowires to define a p-channel field effect transistor (PFET).

A related semiconductor device may include a substrate and a dielectric layer above the substrate. The semiconductor device may further include first and second groups of nanowires within the dielectric layer, with the first group of nanowires comprising silicon and the second group of nanowires comprising silicon germanium.

DETAILED DESCRIPTION OF THE PREFERRED EMBODIMENTS

Figure 1:
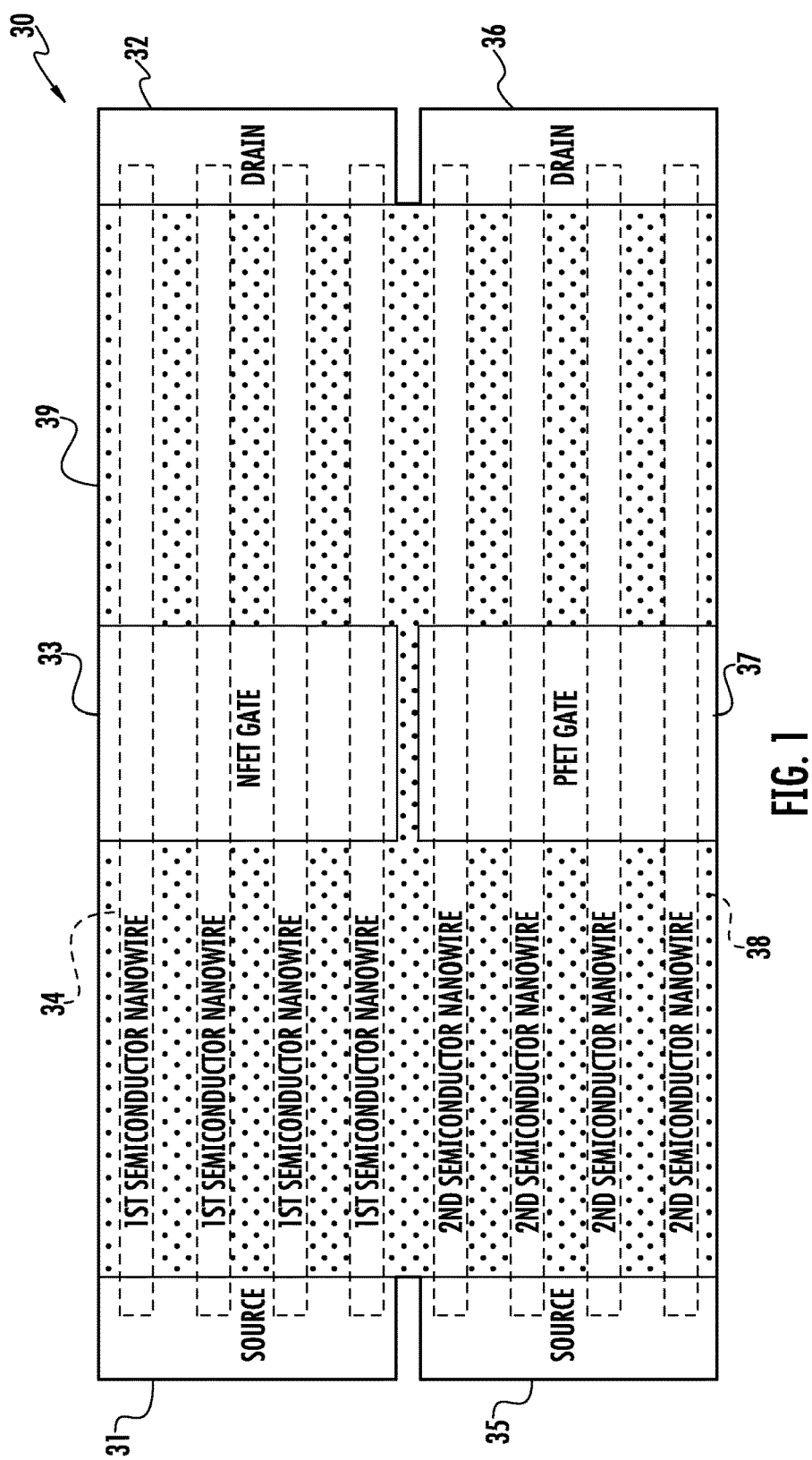
FIG. 1 is a top plan view of a semiconductor device in accordance with an example embodiment including first and second groups of nanowires comprising different semiconductor materials.
Figure 2:
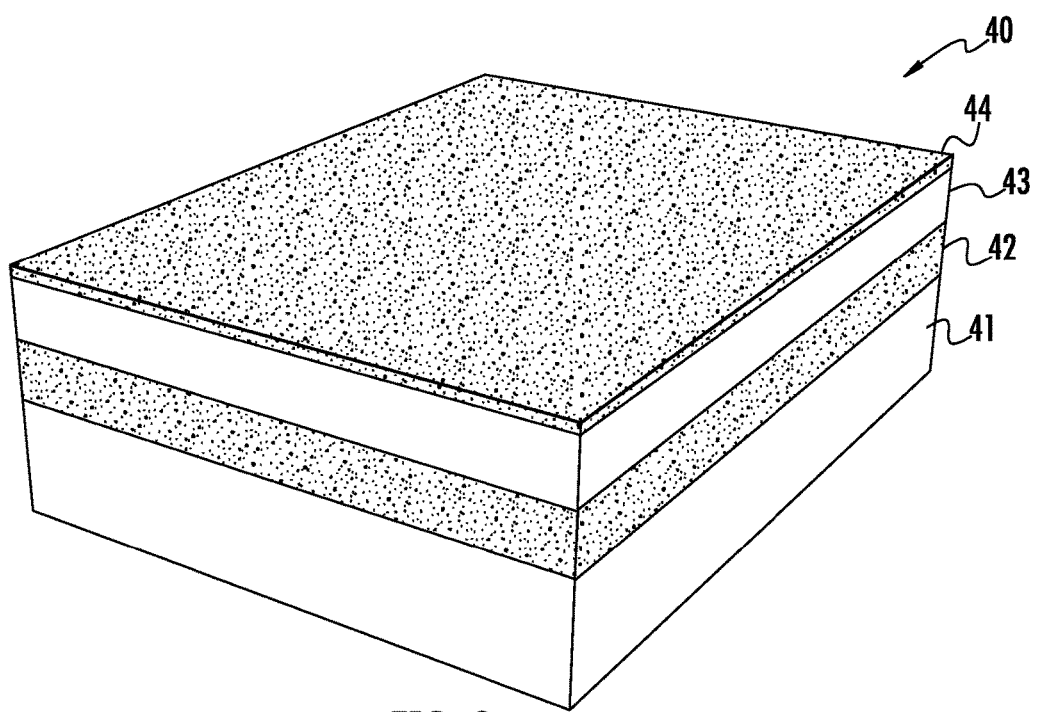
FIGS. 2-4 are a series of perspective views of a semiconductor substrate illustrating fin formation in accordance with an example method for making the semiconductor device of FIG. 1.
Figure 3:
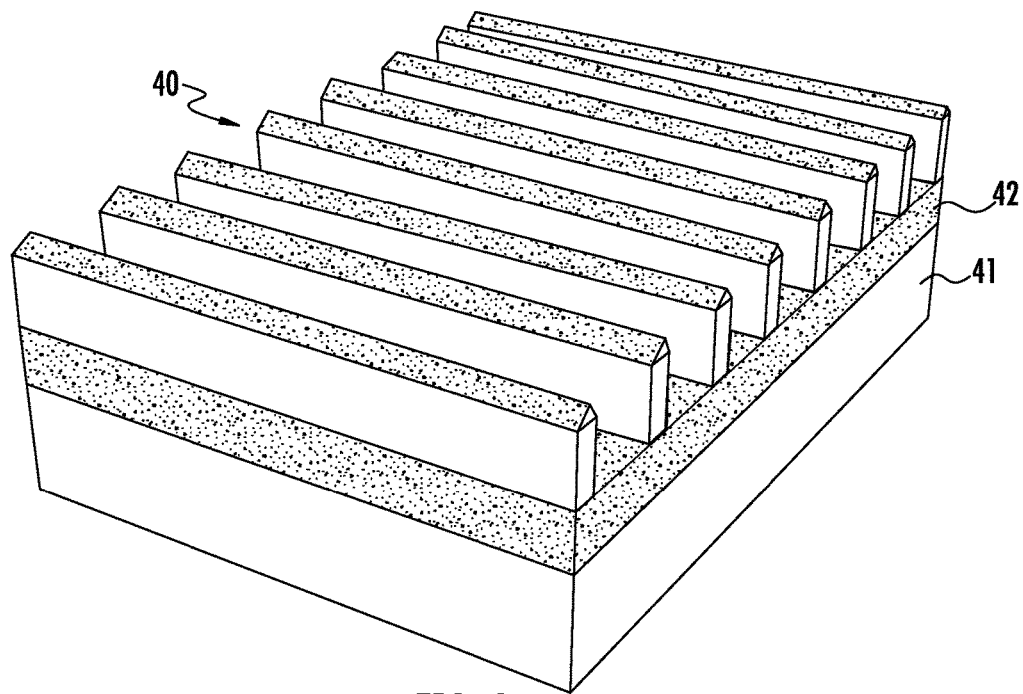

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similarly elements in different embodiments.

By way of background, a typical process for integrating nanowires into a semiconductor device may include, starting from a semiconductor-on-insulator (SOI) substrate, patterning fins using a reactive ion etch (RIE), and forming nanowires through a subsequent hydrogen anneal (to transform the fins into wire (i.e., rounded) shapes), followed by an oxide recess. However, this approach may not allow for co-integration of different types of semiconductor materials for different sets or groups of nanowires on the same wafer, which may be desirable for n-channel or p-channel device types. Moreover, this approach may also require a dummy gate deposition and patterning to stabilize the nanowires during thermal annealing and the oxide recess.

Turning now initially to FIGS. 1-4, a semiconductor device 30 and related method for making the device are first described. In the illustrated embodiment, the semiconductor device 30 is a complementary device including a first pair of source and drain regions 31, 32 and a first gate 33 coupled with a first group of semiconductor nanowires 34 to define an n-channel field effect transistor (NFET), and a second pair of source and drain regions 35, 36 and a second gate 37 coupled with the second group of nanowires 38 to define a p-channel field effect transistor (PFET). However, the first group of nanowires 34 and the second group of nanowires 38 comprise different semiconductor materials. In the illustrated example, the nanowires 34, 38 are supported by a dielectric (e.g., oxide) layer 39. In this example, the dielectric layer 39 is a continuous or unitary layer encapsulating or enclosing all of the nanowires 34, 38 therein, although various dielectric layer configurations may be used, as will be discussed further below.

By way of example, the nanowires 34 of the NFET may comprise silicon, while the nanowires of the PFET may comprise a semiconductor that provides enhanced hole conductivity for p-channel devices, such as silicon germanium (SiGe). However, using the techniques described herein, it will be appreciated that other combinations of materials may be used for the different combinations of nanowires 34, 38, and that more than two groups of nanowires with different respective semiconductor materials may be used in some implementations.

In the present embodiment, fabrication of the semiconductor device 30 begins with an SOI substrate 40 (FIG. 2) including a lower semiconductor layer 41, a buried oxide (BOX) layer 42 (e.g., $SiO_2$) on the lower semiconductor layer, and an upper semiconductor (e.g., single crystal) layer 43. In the present example, the upper semiconductor layer 43 is silicon. Other example options for the substrate may include sSOI or SGOI substrates, as well as rotated or (110) orientations. By way of example, the thickness of the BOX layer 42 may be in a range of 5 to 250 nm, and the thickness of the upper semiconductor layer 43 may be in a range of 5 to 150 nm, although other thicknesses may be used in different embodiments. Also, an oxide (e.g., $SiO_2$) cap layer 44 is also formed on the upper semiconductor layer 43.

The upper semiconductor layer 43 and cap oxide layer 44 may be patterned to form fins 45 (see FIG. 3) using standard fin definition techniques, sidewall image transfer (SIT), direct lithography (immersion, EUV), etc., for example. The fins 45 serve as a template for subsequent epitaxial semiconductor growth on the sides of the fins, which in turn are used to form the nanowires 34, 38, as will be discussed further below. The fins 45 may be cut away or removed in isolation regions to isolate different sections of fins on a wafer, if desired. Moreover, shallow trench isolation (STI) regions 46 may optionally be included in the isolation regions to provide further electrical isolation, as shown.

Figure 6:
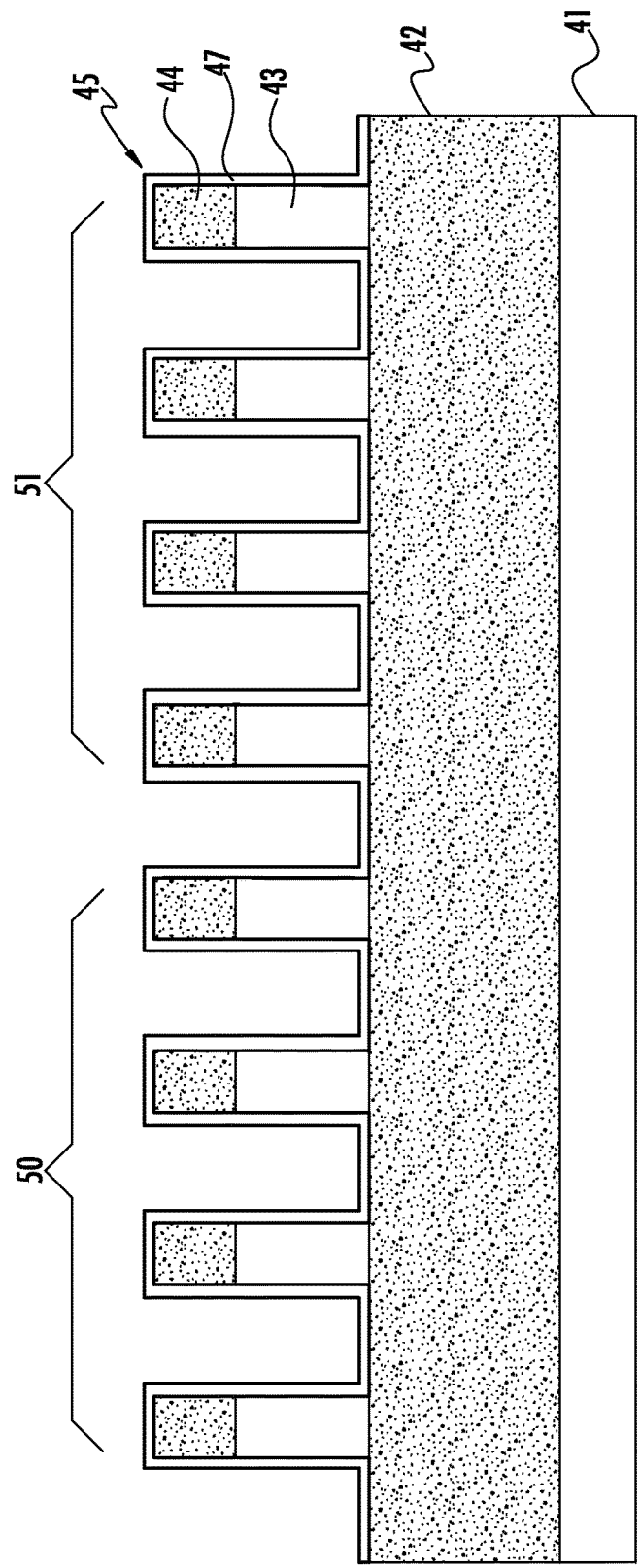

Turning now to the cross-sectional views of FIG. 5-14, a hard mask layer 47 is deposited over all of the fins 45 (FIG. 6). The fins 45 are divided into first and second groups, namely an NFET group 50 which are used to form the first semiconductor nanowires 34 for the NFET device, and a PFET group 51 which are used to form the second semiconductor nanowires 38 for the PFET device. A SiN iRAD deposition of approximately 3-30 nm may be performed, for example.

Figure 7:
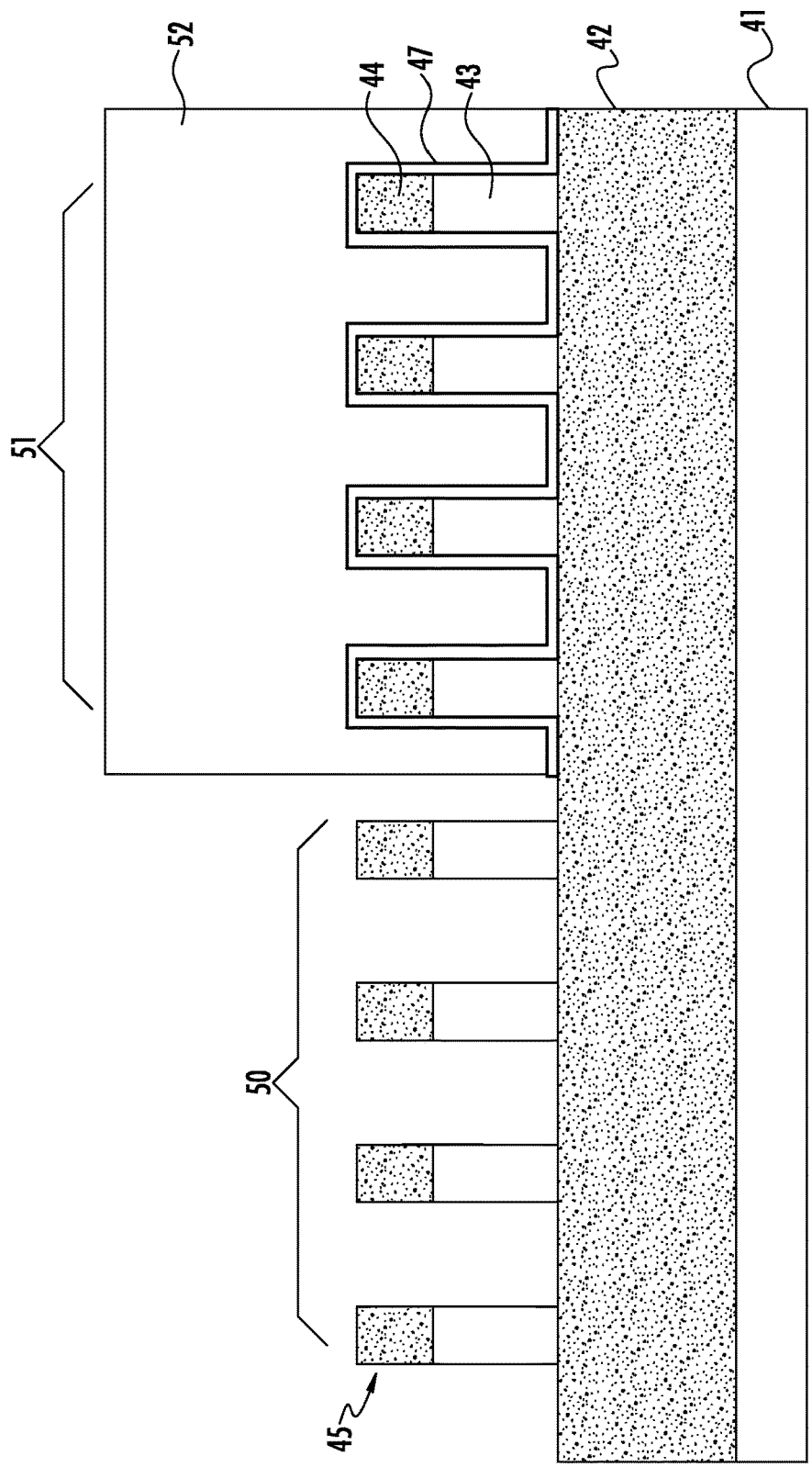

A photoresist layer 52 for block lithography may be deposited over the hard mask layer 47 of the PFET group 51, followed by an etch (e.g., RIE) to selectively remove the hard mask layer from the fins 45 of the NFET group 50 (FIG. 7). The photoresist 52 may then be removed, and epitaxial silicon growth may be performed to grow silicon on the sides of the silicon layer 43 portions of the fins 45, which generally results in a hexagon silicon shape 49 at the base of each NFET fin, as seen in FIG. 8.

Figure 8:
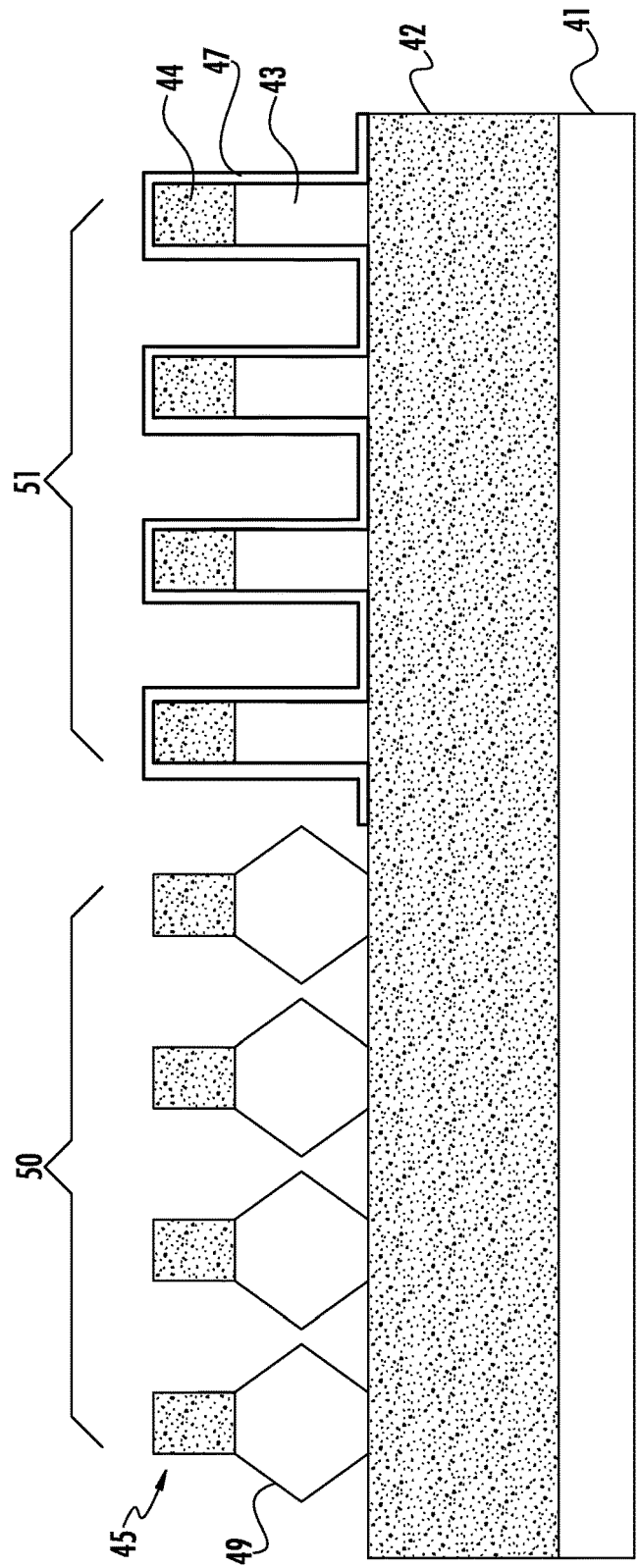
Figure 9:
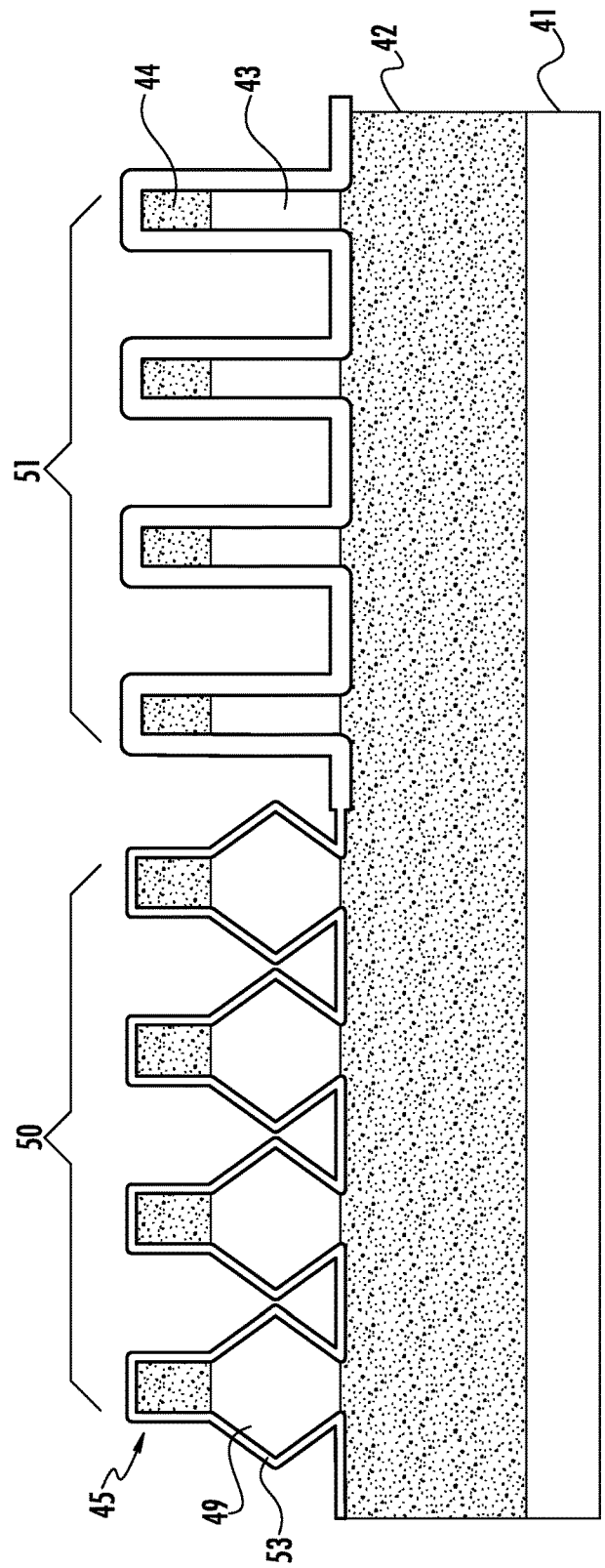
Figure 10:
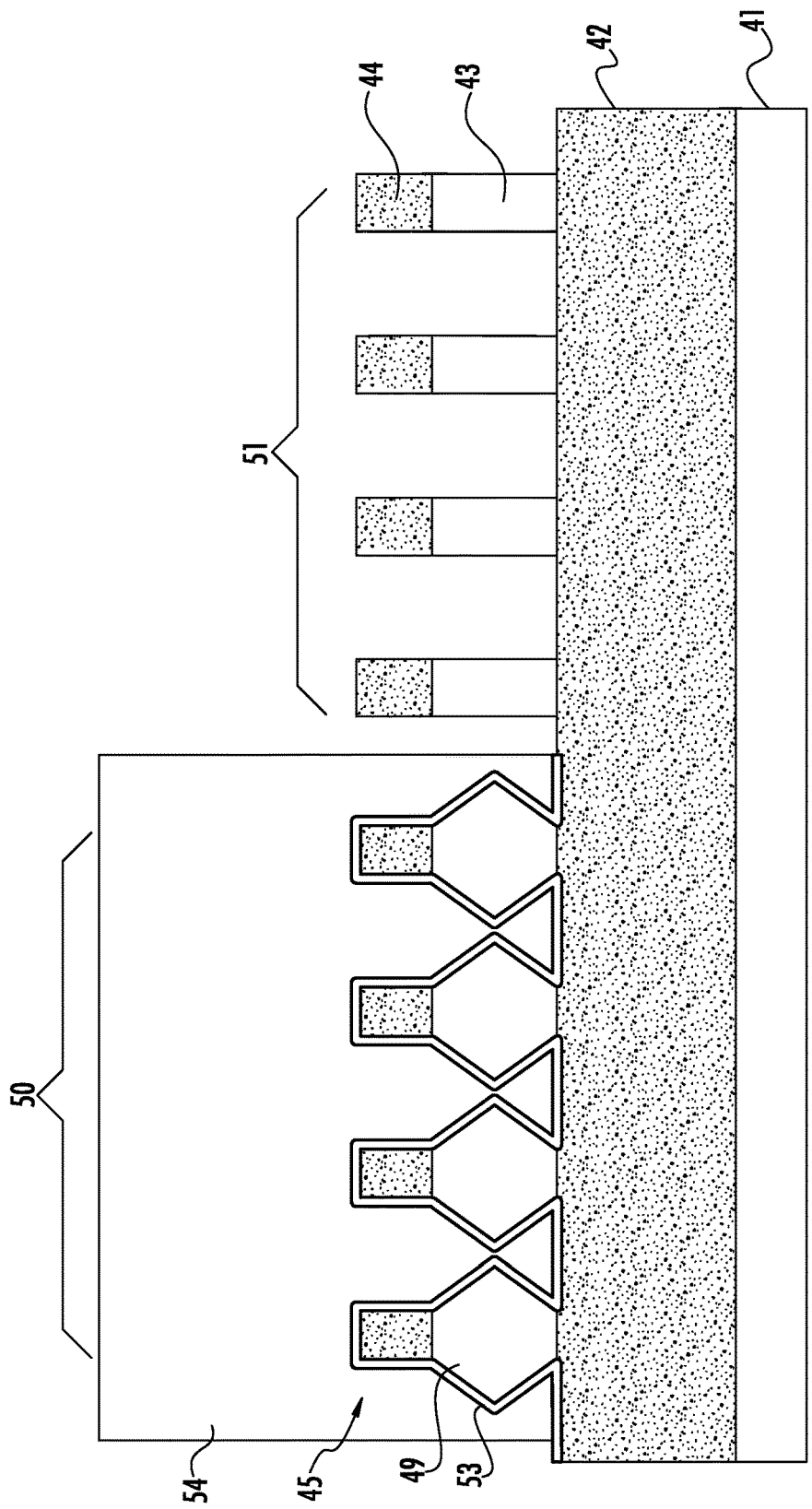
Figure 11:
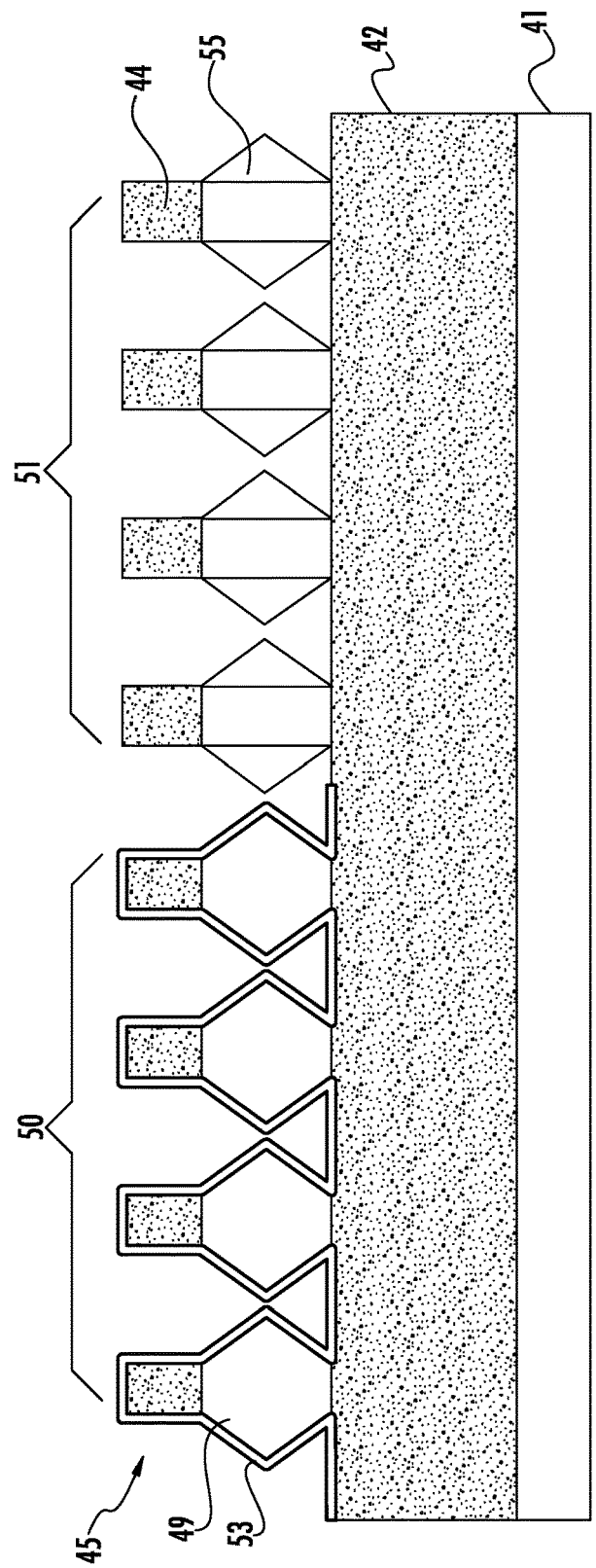
Figure 12:
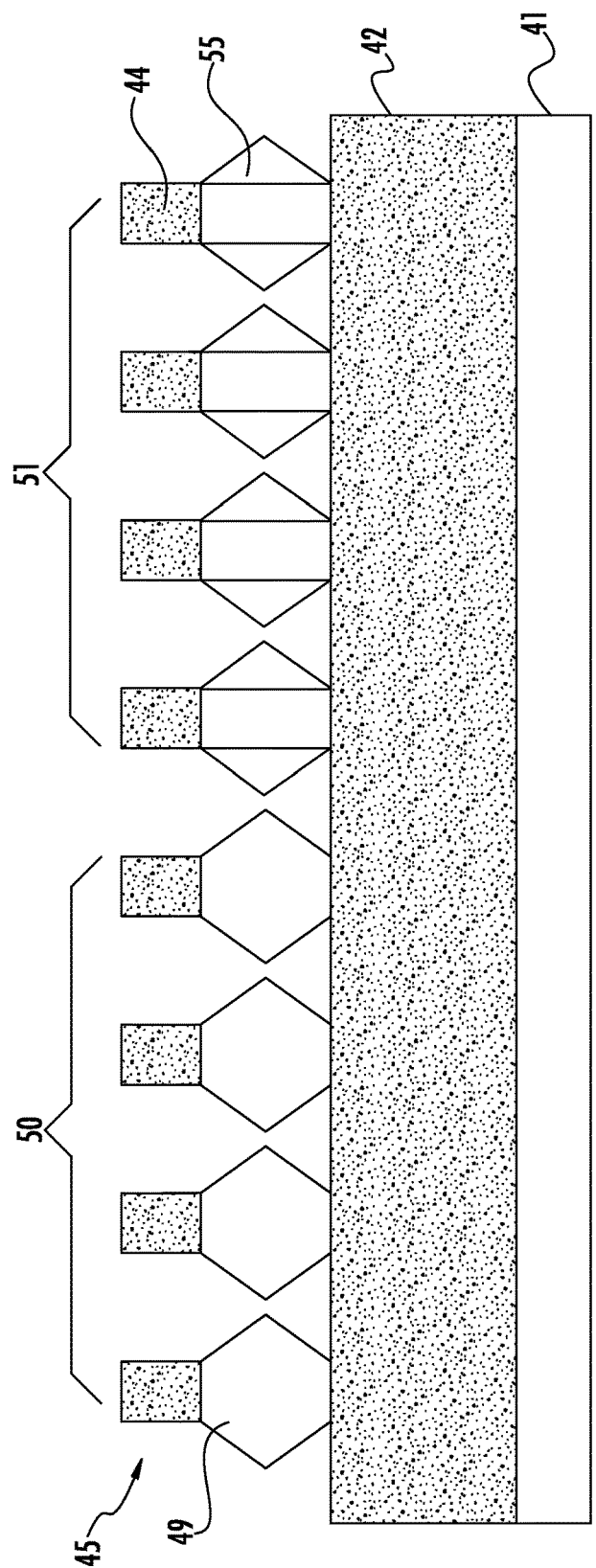

The steps illustrated in FIGS. 6-8 may then be repeated, but this time to grow a second semiconductor material 55 (e.g., SiGe) on the silicon portion of the fins 45 of the second group 51. More particularly, another hard mask layer 53 (e.g., SiN) is once again formed over all of the fins 45 (which adds to the thickness of the hard mask layer 47 on the PFET group 51), as seen in FIG. 9, which again may be a SiN iRAD deposition (e.g., 3-30 nm), for example. A photoresist layer 54 is also formed over the NFET group 50, and the hard mask layer 53, 47 is selectively removed from the PFET group 51 in a similar fashion as described above (FIG. 10). This allows for the growth of the second semiconductor material (e.g., SiGe) 55 on the sides of the lower silicon portions of the fins 45 in the PFET group 51, as shown in FIG. 11. Here again, at this point in the fabrication cycle the lower portions of the fins 45 with the newly added growth will generally resemble a hexagon shape, as schematically represented in FIG. 11, with the laterally extending growth portions 55 on either side of each fin. The remaining hard mask layer 53 may then be selectively removed from the NFET group 50, as shown in FIG. 12.

Figure 4:
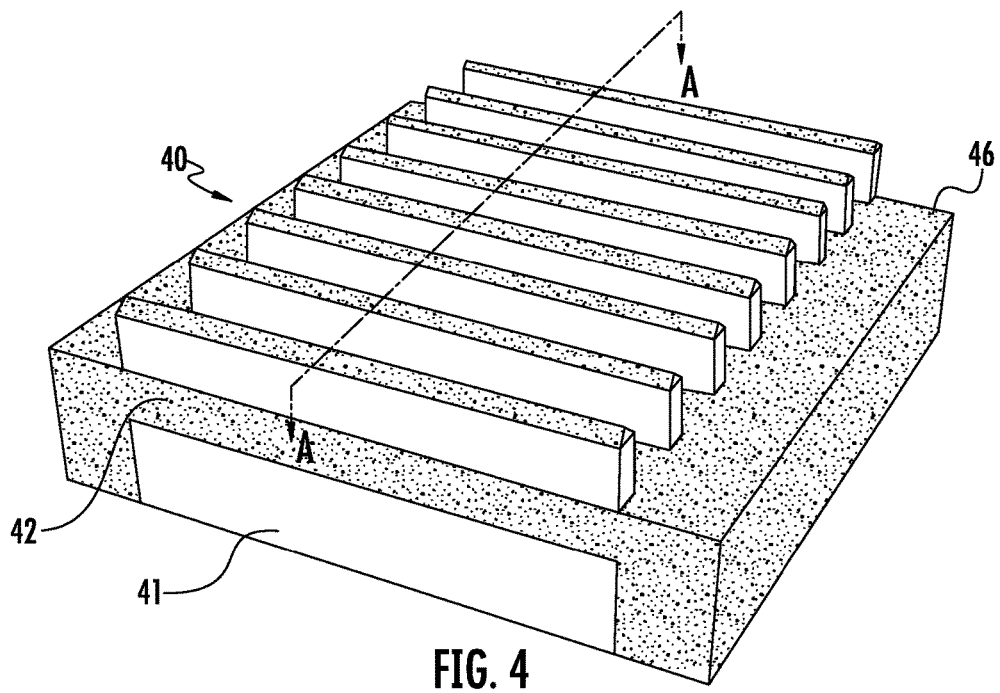
Figure 5:
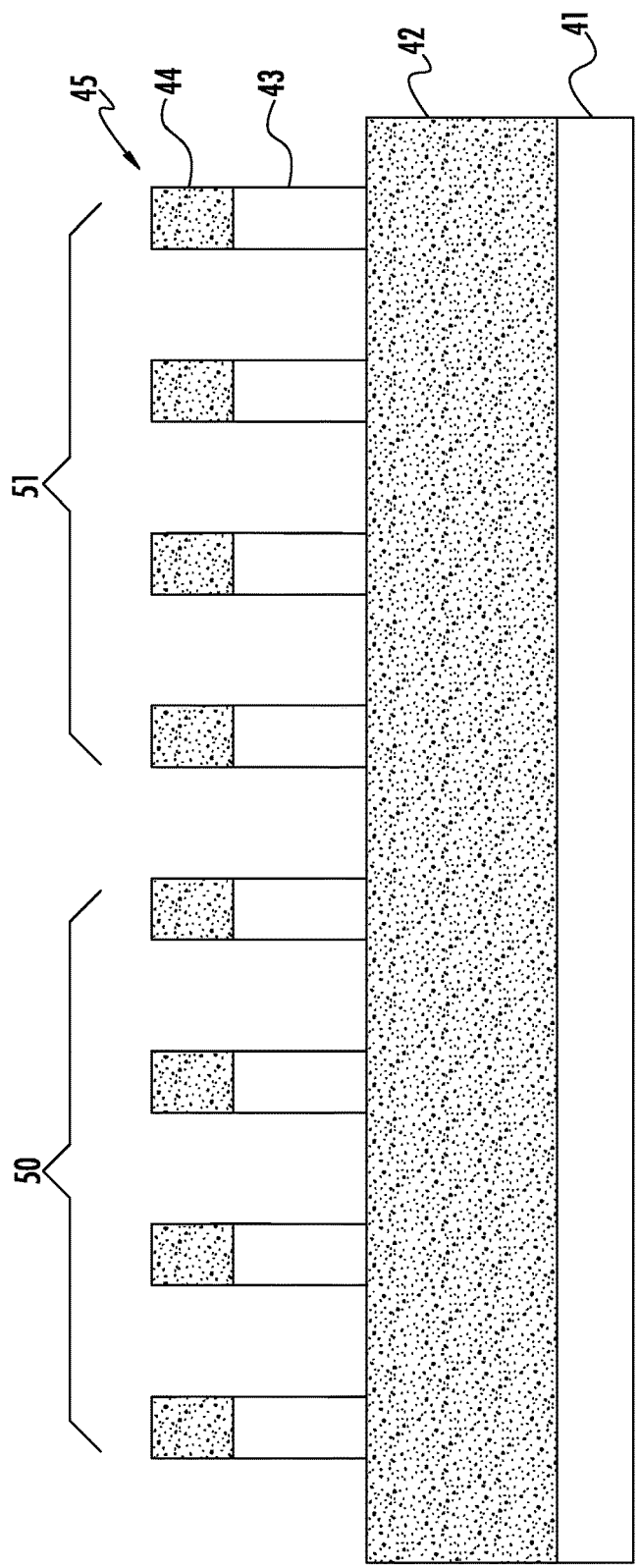
FIGS. 5-16 are a series of cross-sectional diagrams taken along line A-A of FIG. 4 illustrating additional steps in the method of making the semiconductor device of FIG. 1.
Figure 13:
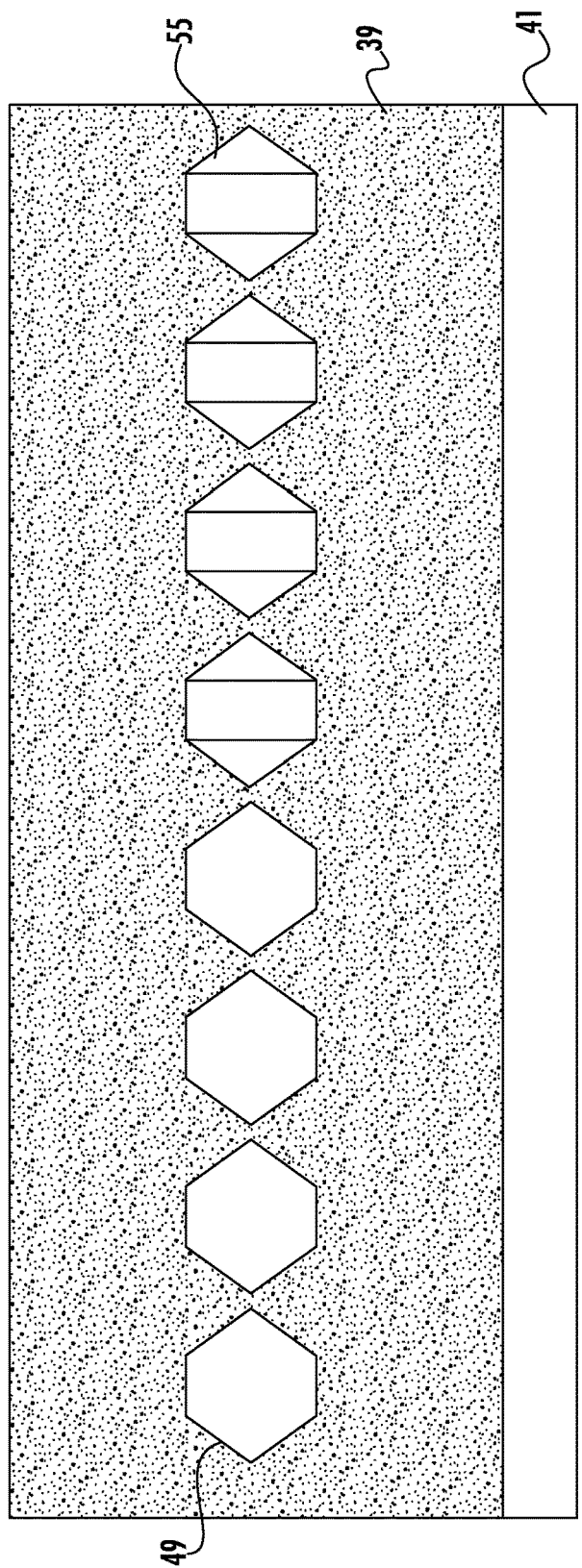
Figure 14:
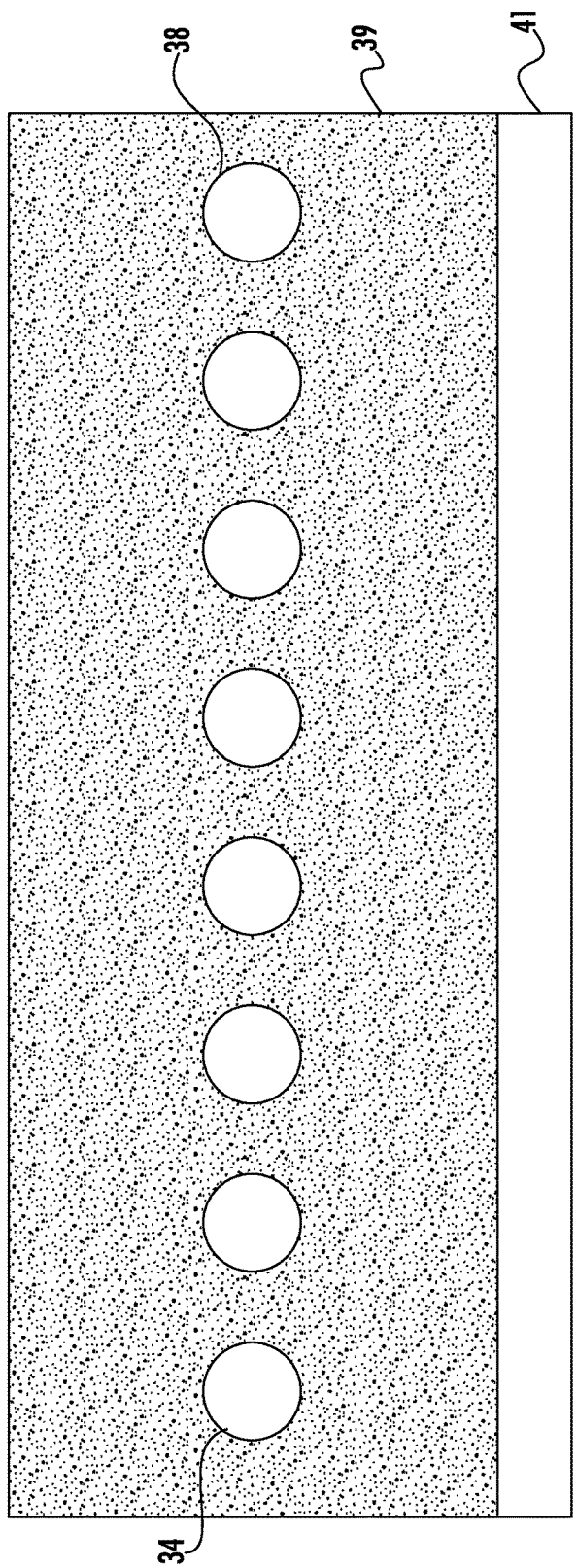

In accordance with one embodiment, an oxide deposition is performed (e.g., $SiO_2$) to encapsulate the silicon hexagons 49 and SiGe regions 55 within the oxide layer 42, as seen in FIG. 13. A thermal oxidization is performed to form the silicon and SiGe nanowires 34, 38 for the NFET and PFET devices, respectively, as seen in FIG. 14. As shown in the illustrated example, this advantageously rounds off the corners, making the nanowires 34, 38 have a more oval or circular cross-section, which in turn provides for enhanced performance as a result of uniform electrical field distribution throughout the nanowires, as will be appreciated by those skilled in the art. As shown in FIG. 4, during thermal oxidization, the Ge atoms from the SiGe regions are diffusing into the original Si fin portions, resulting in SiGe nanowires. Further processing steps to complete the semiconductor device 30 may include recess of the oxide layer 39, dummy gate deposition, which may be used for the subsequent formation of the NFET and PFET gates 33, 37 (which may be replacement metal gates (RMG), for example), formation of the source and drain pairs 31, 32 and 35, 36, etc., as will be appreciated by those skilled in the art.

Figure 15:
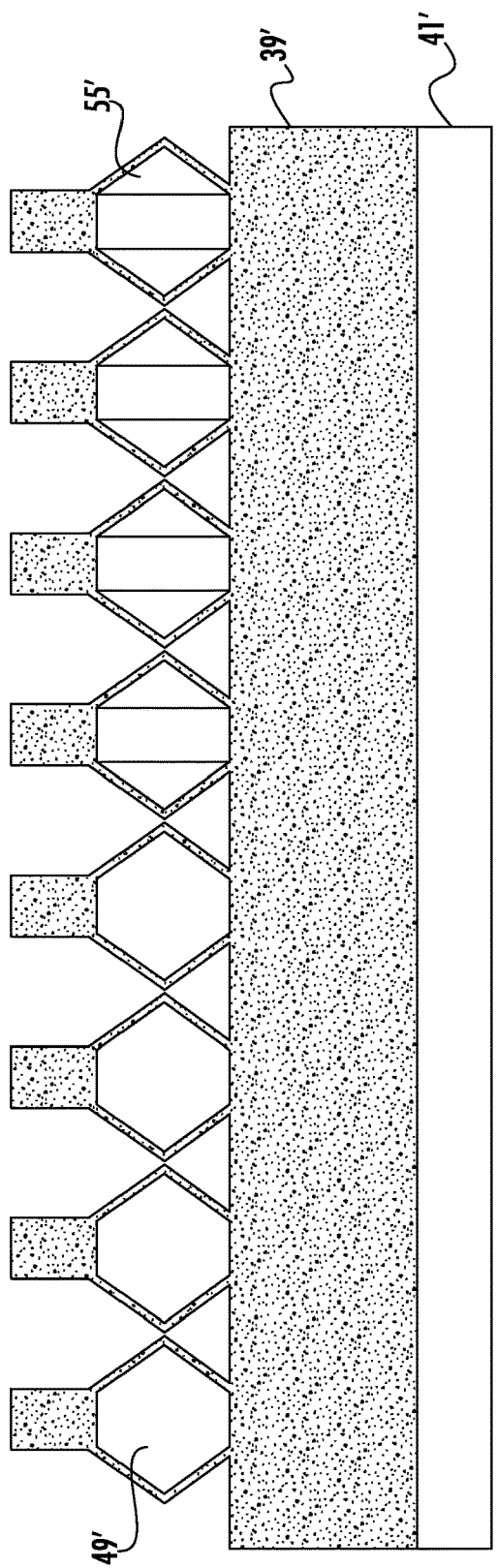
Figure 16:
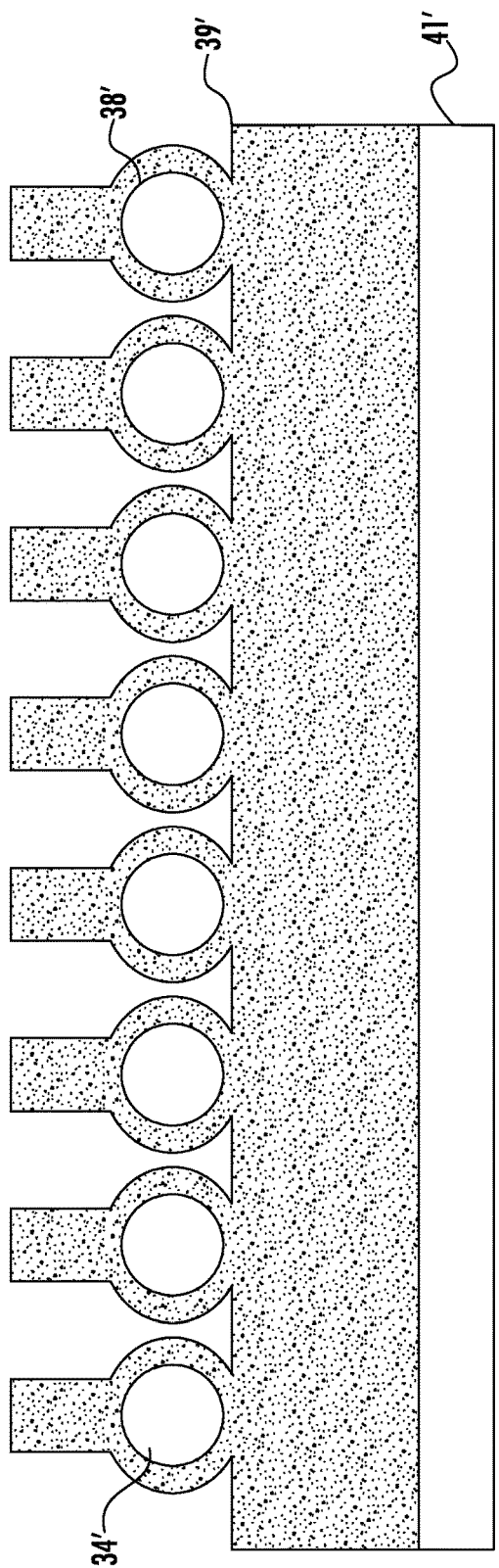

In accordance with another example embodiment, rather than forming the relatively "thick" oxide deposition shown in FIG. 14, a relatively thin oxide deposition 60' may instead be used, if desired, to form the oxide encapsulation layer 39' shown in FIG. 15, followed by a thermal oxidation to form the nanowires 34', 38' (FIG. 16). This approach may provide somewhat less support or protection for the nanowires 34', 38' than the above-described approach, but it may also be somewhat easier to implement as well.

In the examples described above, the epitaxial silicon growth on the NFET group 50 occurs first, followed by the SiGe growth on the PFET group 51, but it should be noted that this order may be reversed if desired (i.e., the SiGe growth on the PFET group 51 may be performed first). Moreover, the above-described approach may be used with different types of semiconductors to produce different semiconductor nanowire combinations than the examples described above, as will be appreciated by those skilled in the art.

The above-described embodiments may advantageously provide for relatively easy co-integration of different types of semiconductor nanowires (e.g., silicon and SiGe) on a same wafer. Moreover, this approach may avoid the need for a separate dummy gate prior to nanowire formation, as in prior approaches. Moreover, the nanowires are formed at the fin level, which may allow for a more robust and controllable integration, as will be appreciated by those skilled in the art.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:
    forming a first group of nanowires and a second group of nanowires on a substrate, the first group of nanowires comprising a first semiconductor material and the second group of nanowires comprising a second semiconductor material, the first and second groups of nanowires being encapsulated by a dielectric layer, the forming of the first group and second group of nanowires including:
    forming, above the substrate, a plurality of fins;
    forming the first semiconductor material on sides of a first group of the plurality of fins corresponding to the first group of nanowires;
    forming the second semiconductor material on sides of a second group of the plurality of fins at a different time from the forming of the first semiconductor material, the second group of the plurality of fins corresponding to the second group of nanowires;
    forming the dielectric layer on a surface of the first semiconductor material on the sides of the first group of the plurality of fins and a surface of the second semiconductor material on the sides of the second group of the plurality of fins; and
    rounding corners of the plurality of fins by performing a thermal treatment on the plurality of fins encapsulated by the dielectric layer, thereby forming the first group and the second group of nanowires, respectively.

2. The method of claim 1 wherein forming the first and second semiconductor materials further comprises forming at least one mask layer overlying the first and second groups of the plurality of fins, and selectively removing the at least one mask layer to expose the first or second groups of the plurality of fins prior to forming the first or second semiconductor materials, respectively.

3. The method of claim 2 further comprising forming a first photoresist layer to cover the first group of the plurality of fins prior to removing the at least one mask layer from the second group of the plurality of fins, and forming a second photoresist layer to cover the second group of the plurality of fins prior to removing the at least one mask layer from the first group of the plurality of fins.

4. The method of claim 2 wherein the at least one mask layer comprises at least one silicon nitride layer.

5. The method of claim 1 wherein the first semiconductor material comprises silicon.

6. The method of claim 1 wherein the second semiconductor material comprises silicon germanium.

7. The method of claim 1 wherein each fin of the plurality of fins comprises a lower semiconductor portion and an upper dielectric portion.

8. The method of claim 1 further comprising forming a first pair of source and drain regions and a first gate coupled with the first group of nanowires to define an n-channel field effect transistor (NFET), and forming a second pair of source and drain regions and a second gate coupled with the second group of nanowires to define a p-channel field effect transistor (PFET).

9. A method for making a semiconductor device comprising:
    forming, above a substrate, a plurality of fins each having a lower silicon portion and an upper dielectric portion;
    forming silicon on sides of the lower silicon portions of a first group of the plurality of fins;
    forming silicon germanium on sides of the lower silicon portions of a second group of the plurality of fins after forming the silicon on the sides of the lower silicon portions of the first group of the plurality of fins;
    forming first and second groups of nanowires within a dielectric layer by forming the dielectric layer encapsulating the plurality of fins, the first group of nanowires including silicon and the second group of nanowires including silicon germanium; and
    rounding corners of the first and second groups of nanowires within the dielectric layer by performing a thermal treatment.

10. The method of claim 9 wherein forming the silicon and silicon germanium further comprises forming at least one mask layer overlying the first and second groups of the plurality of fins, and selectively removing the at least one mask layer to expose the first or second groups of the plurality of fins prior to forming the silicon or silicon germanium, respectively.

11. The method of claim 10 wherein the at least one mask layer comprises at least one silicon nitride layer.

12. The method of claim 9 further comprising forming a first pair of source and drain regions and a first gate coupled with the first group of nanowires to define an n-channel field effect transistor (NFET), and forming a second pair of source and drain regions and a second gate coupled with the second group of nanowires to define a p-channel field effect transistor (PFET).

13. A method for making a semiconductor device comprising:
    forming, above a substrate, a plurality of fins each having a lower silicon portion and an upper dielectric portion;
    forming silicon germanium sidewalls on sides of the lower silicon portions of a first group of the plurality of fins;
    growing silicon sidewalls on sides of the lower silicon portions of a second group of the plurality of fins after forming the silicon germanium sidewalls, the growing the silicon sidewalls leaving sides of the upper dielectric portions of the second group of the plurality of fins exposed;
    forming a dielectric layer encapsulating the plurality of fins including the silicon germanium sidewalls and the silicon sidewalls;
    forming a first group of nanowires within the dielectric layer by performing a thermal treatment on the second group of the plurality of fins and the silicon sidewalls, the first group of nanowires comprising silicon and having oval-shaped or circular cross-sections; and
    forming a second group of nanowires within the dielectric layer by performing the thermal treatment on the first group of the plurality of fins and the silicon germanium sidewalls, the second group of nanowires comprising silicon germanium and having oval-shaped or circular cross-sections.

14. The method of claim 13 wherein forming the silicon germanium further comprises forming at least one mask layer overlying the first group of the plurality of fins, and selectively removing the at least one mask layer to expose the first group of the plurality of fins prior to forming the silicon germanium.

15. The method of claim 14 wherein the at least one mask layer comprises at least one silicon nitride layer.

16. The method of claim 13 further comprising forming a first pair of source and drain regions and a first gate coupled with the first group of nanowires to define an n-channel field effect transistor (NFET), and forming a second pair of source and drain regions and a second gate coupled with the second group of nanowires to define a p-channel field effect transistor (PFET).

* * * * *